United States Patent
Kumar et al.

(10) Patent No.: US 7,867,353 B2
(45) Date of Patent: Jan. 11, 2011

(54) THERMALLY AND ELECTRICALLY CONDUCTIVE INTERFACE

(75) Inventors: Sundaram Nand Kumar, Schaumburg, IL (US); Gary Sites, Rancho Cucamonga, CA (US); Bhavik Patel, Bloomingdale, IL (US)

(73) Assignee: American Standard Circuits, Franklin Park, IL (US)

( * ) Notice: Subject to any disclaimer, the term of this patent is extended or adjusted under 35 U.S.C. 154(b) by 0 days.

(21) Appl. No.: 12/141,257

(22) Filed: Jun. 18, 2008

(65) Prior Publication Data

US 2008/0251199 A1 Oct. 16, 2008

Related U.S. Application Data

(62) Division of application No. 11/349,842, filed on Feb. 8, 2006, now Pat. No. 7,527,873.

(51) Int. Cl.
| | |
|---|---|
| *B29C 65/00* | (2006.01) |
| *B32B 37/00* | (2006.01) |
| *B32B 9/04* | (2006.01) |
| *B32B 9/06* | (2006.01) |
| *B32B 11/06* | (2006.01) |
| *B32B 15/04* | (2006.01) |
| *C09J 5/00* | (2006.01) |
| *B05D 3/02* | (2006.01) |

(52) U.S. Cl. .................. 156/289; 156/311; 427/387; 428/447; 428/448; 428/449; 428/450

(58) Field of Classification Search .................. 156/289, 156/311; 427/387; 428/447–450
See application file for complete search history.

(56) References Cited

U.S. PATENT DOCUMENTS

| | | | |
|---|---|---|---|
| 3,514,424 A | 5/1970 | Brower et al. |
| 3,840,492 A | 10/1974 | Smith |
| 4,574,879 A | 3/1986 | DeGree et al. |
| 4,602,125 A | 7/1986 | West et al. |
| 4,602,678 A | 7/1986 | Fick |

(Continued)

OTHER PUBLICATIONS

Furnival, Courntey R., "Thermal and High Current Multilayer Printed Circuit boards with Thermagon T-lam and Hybrid Boards," Jan. 31, 2001.

(Continued)

*Primary Examiner*—Philip C Tucker
*Assistant Examiner*—Michael N Orlando
(74) *Attorney, Agent, or Firm*—McDonnell Boehnen Hulbert & Berghoff LLP

(57) ABSTRACT

A thermally and electrically conductive material is provided as a mixture of a dimethylpolysiloxane, metal (or one metal coated with another metal) flakes and/or granules, a peroxide-based and/or a dimethyl hexane based catalyst, PTFE powder and a platinum based fire retardant. The thermally and electrically conductive material may be pre-formed into a film or pad and each side of the film protected with removable release layers. The thermally and electrically conductive material may alternatively be produced in a screen-printable paste. As such, a layer of the thermally and electrically conductive paste may be screen-printed on the metal surface in a complete sheet form or as a patterned film by using a stencil patterned screen mesh. Processes for manufacturing high- and low-frequency circuits that include the interface material are also provided.

7 Claims, 3 Drawing Sheets

U.S. PATENT DOCUMENTS

| | | |
|---|---|---|
| 4,685,987 A | 8/1987 | Fick |
| 4,810,563 A | 3/1989 | DeGree et al. |
| 4,842,911 A | 6/1989 | Fick |
| 4,852,646 A | 8/1989 | Dittmer |
| 4,869,954 A | 9/1989 | Squitieri |
| 4,907,124 A | 3/1990 | Kaufman |
| 4,960,634 A | 10/1990 | Boyko et al. |
| 5,213,868 A | 5/1993 | Liberty et al. |
| 5,298,791 A | 3/1994 | Liberty et al. |
| 5,463,530 A | 10/1995 | DeGree |
| 5,545,473 A | 8/1996 | Ameen et al. |
| 5,591,034 A | 1/1997 | Ameen et al. |
| 5,652,055 A | 7/1997 | King et al. |
| 5,679,457 A | 10/1997 | Bergerson |
| 5,725,922 A | 3/1998 | Nakamura et al. |
| 5,738,936 A | 4/1998 | Hanrahan |
| 5,766,740 A | 6/1998 | Olson |
| 5,798,171 A | 8/1998 | Olson |
| 6,054,198 A | 4/2000 | Bunyan et al. |
| 6,165,612 A | 12/2000 | Misra |
| 6,174,841 B1 | 1/2001 | Yamada et al. |
| 6,309,563 B1 | 10/2001 | Iino et al. |
| 6,384,171 B1 | 5/2002 | Yamazaki et al. |
| 6,414,078 B1 | 7/2002 | Fukushima et al. |
| 6,616,999 B1 | 9/2003 | Freuler et al. |
| 6,706,799 B2 | 3/2004 | Igarashi et al. |
| 6,734,250 B2 | 5/2004 | Azechi et al. |
| 6,783,692 B2 | 8/2004 | Bhagwagar |
| 6,799,628 B1 | 10/2004 | Masseth et al. |
| 6,852,573 B2 | 2/2005 | Ebihara et al. |
| 6,945,312 B2 | 9/2005 | Czubarow et al. |
| 2002/0092163 A1 | 7/2002 | Fraivillig |
| 2003/0047721 A1 | 3/2003 | Igarashi et al. |
| 2003/0096116 A1 | 5/2003 | Mita et al. |
| 2003/0234074 A1* | 12/2003 | Bhagwagar ............... 156/325 |
| 2004/0043229 A1 | 3/2004 | Aoki et al. |
| 2004/0052998 A1 | 3/2004 | Freuler et al. |
| 2004/0055152 A1 | 3/2004 | Fraivillig |
| 2004/0075076 A1* | 4/2004 | Bhagwagar ............... 252/70 |
| 2004/0094293 A1 | 5/2004 | Mita et al. |
| 2004/0241410 A1* | 12/2004 | Fischer et al. ........... 428/292.1 |
| 2004/0254275 A1 | 12/2004 | Fukui et al. |
| 2005/0109766 A1 | 5/2005 | Miller et al. |
| 2005/0208251 A1 | 9/2005 | Aisenbrey |

OTHER PUBLICATIONS

"Thermally Conductive Insulators," T-Gon 200 Series.
"Sil-Pad 400", The Original Sil-Pad Material.
Encyclopedia of Polymer Science and Engineering, vol. 15, Scattering to Structural Foams (pp. 252-258 and cover page, 8 pages total), John Wiley and Sons, 1989.

* cited by examiner

THERMALLY AND ELECTRICALLY CONDUCTIVE INTERFACE

CROSS-REFERENCE TO RELATED APPLICATIONS

This application is a divisional of U.S. patent application Ser. No. 11/349,842 filed Feb. 8, 2006, now U.S. Pat. No. 7,527,873.

FIELD OF THE INVENTION

The present invention relates to electrical interfacing in electronic devices and more specifically relates to using an interface material to bond a high or low frequency circuit board with a heat sink.

BACKGROUND

As electronic components become smaller and more powerful, their heat dissipation requirements also rise dramatically. With high or low frequency printed circuit board (PCB) assemblies when an aluminum heat sink is attached to a printed circuit board, an interface must be used that ensures a proper electrical connection. The interface may also serve as a thermal connector.

Historically, electrically (and thermally) conductive interface materials are mainly based on thermoset polymers, such as epoxy resins. Once a thermoset polymer is cured, it is inflexible. Thus, a major drawback of interface materials based on thermoset polymers is their inability to expand or contract with changes in the surrounding temperature. Also, epoxy resins usually have a lower temperature stability (up to about 400 F) as compared to silicones that can be used up to about 550 F. As a result, high power PCBs based on thermoset interfaces can exhibit weakening or even delamination at the circuit/heat sink interface if the interface temperature exceeds about 400 F due to the high heat generated during the performance of high power electronic components that are assembled over the PCB. There is a need, therefore, for an advancement in the art of preparing electrically and thermally conductive interface materials and in manufacturing circuit board assemblies using the interface material.

SUMMARY

The present invention is directed to an electrically and thermally conductive interface material and its application in a circuit board assembly. An electrically and thermally conductive interface material ("interface") is provided as a mixture of a silicone-based compound, metal flakes and/or granules, flame retardant and a curing catalyst. The interface material may be pre-formed into a film or pad aid each side of the film protected with removable release layers. Each side of the film may also include a coating of an adhesive material that aids in coupling the interface film with a metal surface. The interface material may alternatively be produced in a screen-printable paste. As such, a layer of the interface material paste may be screen-printed on the metal surface. The screen used for printing the paste on the metal surface can be either without any stencil pattern to allow the entire metal surface to be covered with the paste, or the screen can be mask patterned suitably to allow the paste applied in the corresponding pattern form on the metal surface.

The interface material is sandwiched between a printed circuit board and a heat sink to form the circuit board assembly. The interface film can be precut (e.g., by using a stencil to obtain complex film shapes), properly aligned and sandwiched between a printed circuit board and heat sink to form the assembly. In a multi-step press process for bonding, the assembly is cured and a laminate formed. The multi-step process includes a first pressure treatment applied to the assembly at room temperature to increase surface contact and to remove air pockets, a second pressure treatment applied to the assembly at a high temperature to cure the interface and create a laminate; and a third pressure treatment applied to the assembly at room temperature to controllably return the assembly to room temperature. The bonding process may also include a priming function that prepares metal surfaces of the circuit board and heat sink for receiving the interface material.

The interface material may also be applied in other formats, such as multi-layer circuits and to fill vias and channels in a circuit board. Further, the material may serve as an interface between a circuit component and a heat sink or other element.

It is expected that the invention will be useful in printed circuit board (PCB) assemblies that operate at various frequencies. These include high frequency applications such as those used in wireless communication systems (e.g., up to 40 GHz) and/or Radiofrequency (Rf) systems, as well systems that operate at much lower frequency.

The foregoing as well as other aspects, advantages, and alternatives will become apparent to those of ordinary skill in the art by reading the following detailed description and claims, with reference where appropriate to the accompanying drawings.

DETAILED DESCRIPTION OF AN EXEMPLARY EMBODIMENT

1. Overview

Figure 1:
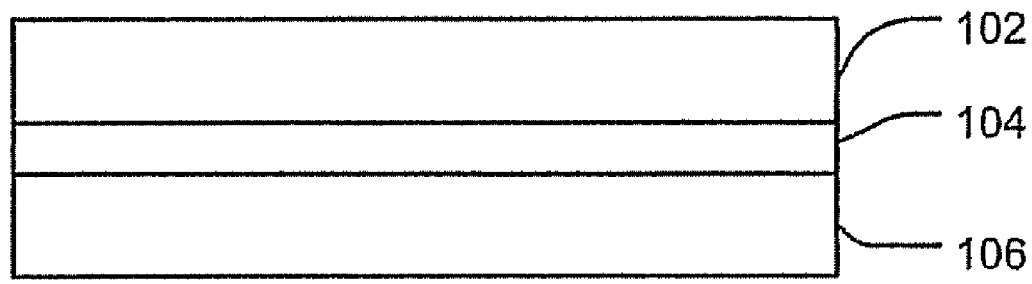
FIG. 1 is a block diagram illustrating a circuit board assembly according to an exemplary embodiment.

Referring to the drawings, FIG. 1 is a diagram illustrating a circuit board assembly according to an exemplary embodiment. In the assembly, interface material 104 is sandwiched between a circuit board 102 and a heat sink 106. In operation, excess heat generated by components mounted on the circuit board 102 may be shunted through interface material 104 to heat sink 106.

Generally, the interface material 104 is composed of a silicone-based dielectric and metal flakes or granules. When cured in a hot-press method, the interface material 104 also provides a mechanical bond to help secure the assembly. An organic catalyst is included to aid in the curing process. A flame retardant is added to suppress any burning tendency.

The circuit board 102 is a printed (or printable) circuit board (PCB) on which electronic components may be mounted and may include a non-conducting substrate layer, such as a polytetrafluoroethylene (PTFE) and/or a fiberglass layer. In addition, the circuit board 102 preferably includes a metal base layer constructed of copper, for instance.

The heat sink 106 is a metal element, such as an aluminum, brass or copper element configured to receive a heat transfer along a planar side (or a side contoured to any other non planer shape of the ground plane of the PCB) and to release excess heat from its other surfaces. While the heat-sink may be configured as a simple rectangular block, other configurations that may add additional surface area may be appropriate.

In manufacture, the interface material 104 may be applied either as a screen-printable mixture or as a pre-formed laminate.

2. Silicone Based Electrically and Thermally Conductive Material

According to the exemplary embodiment, the electrically and thermally conductive interface is composed of a mixture having silicone-based compound as the primary ingredient. The silicone-based compound may, for instance be a dimethyl polysiloxane (DMPS), commercially available from sources such as, Dow Corning, General Electric, Wackers, etc. Beneficially, the silicone-based compound is easily obtainable and is more resistant to thermal shocks than other compounds such as an epoxy. Preferably, the silicone based compound is present in the interface mixture at a concentration of about 40% to about 75% of silicone base, by weight based on the total weight of the interface material.

Metal flakes and/or granules are included in the interface mixture to provide electrically and thermally conductive properties. Examples of the metal that may be used include silver, silver plated particles made up of other materials such as aluminum, etc. The currently preferred type is silver. The metal flakes and/or particles are about 100 to 300 micrometers (microns) in average diameter, and are present in the interface mixture at a concentration of about 20% to about 75%, preferably about 40% to about 75%, by weight (of metal) based on the total weight of the interface material.

A curing catalyst is included in the interface mixture to promote and/or control the curing reaction. The curing catalyst may also serve as a hardener. The catalyst is present in the interface mixture at a concentration of about 0.1% to about 10% by weight based on the total weight of the interface material. As is understood by those skilled in the art, other materials are added to the interface mixture to provide various functionalities. By way of example, the interface mixture may include one or more of the following components: up to about 5% by weight of the total weight of the interface mixture of benzoyl peroxide (as, e.g., a catalyst), up to about 5% by weight of the total weight of the interface mixture of PTFE, up to about 5% by weight based on the total weight of the interface mixture of 2,5-dimethylhexane, (which is the primary catalyst) and alumina trihydrate-platinum mixture as a fire retardant. The platinum-alumina trihydrate mixture may include between about 5.0% and 30.0%, by weight based on the total weight of the interface material. The platinum-alumina trihydrate mixture may include between about 0.1% and 2.0% platinum metal in alumina hydrate by weight based on the total weight of the platinum-alumina trihydrate mixture itself.

3. Laminate Layer

In an exemplary embodiment, the interface material is pre-manufactured (Pre-formed) film (laminate) that can be placed between the circuit board and the heat sink during assembly.

Figure 2A:
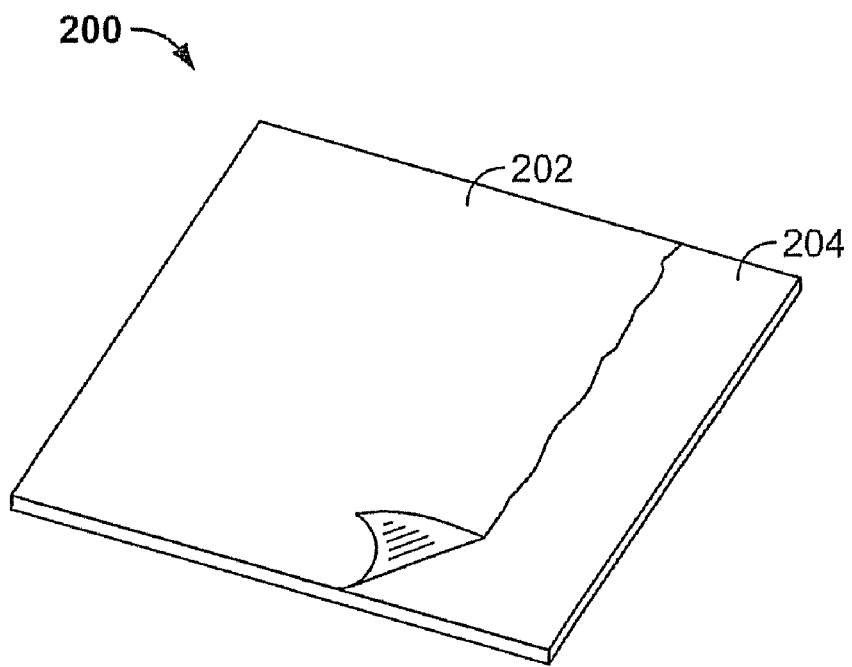
FIG. 2(a) is a perspective view of an interface film in sheet form.

FIG. 2(a) provides an exemplary embodiment of the interface film in a sheet form. As manufactured, a protected interface film 200 includes the interface film 204, a first release layer 202 protecting a first side of the interface film 204 and a second release layer (not shown) protecting a second side of the interface film 204. An embodiment provides sheets sized at approximately 10"×10"×6 mil. Another embodiment provides sheets sized at approximately 18"×12"×5 mil.

In operation, the release layers are removed to reveal the bare interface film 204 prior to placing the film within the circuit board assembly.

Figure 2B:
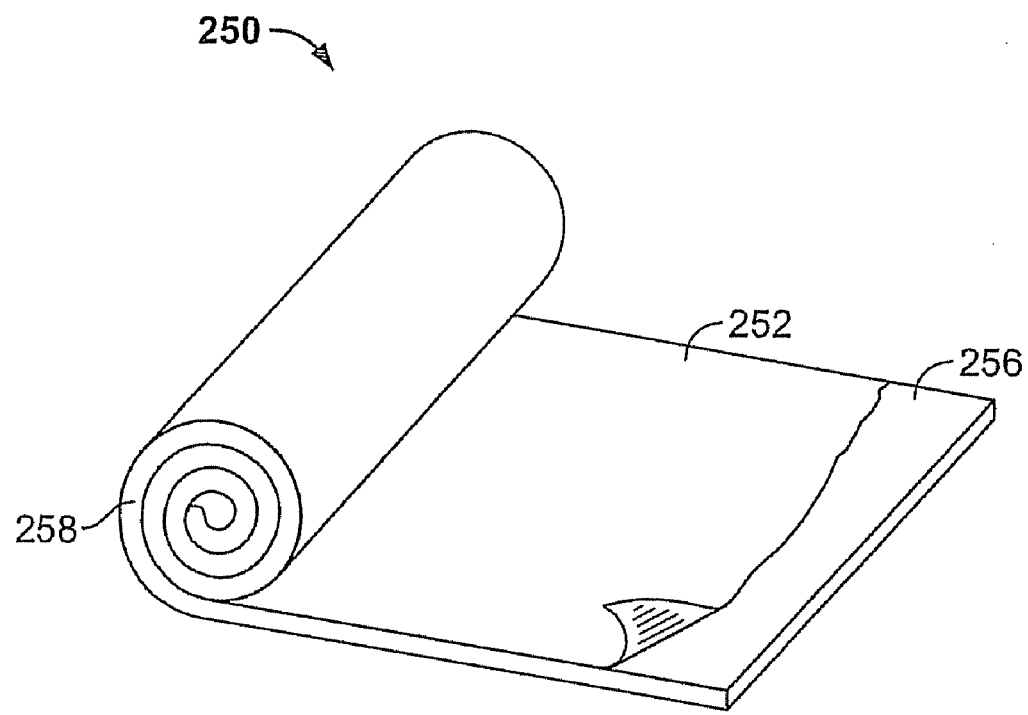
FIG. 2(b) is a perspective view of an interface film in roll form.

FIG. 2(b) provides an exemplary embodiment of the interface film in a roll form. As manufactured a rolled protected interface film 250 includes the rolled interface film 256, a first rolled release layer 252 protecting a first side of the rolled interface film 256 and a second release layer (not shown) protecting a second side of the rolled interface film 256. A roll 258 allows a large amount of interface film to be stored without unduly bending or crimping the film. In operation, a portion of the rolled protected interface film 250 may be unrolled and cut according to manufacturing needs. As used herein, the term "interface film" includes, but is not limited to, the sheet form and the rolled form.

In the exemplary embodiment, the mixture as described provides adhesive properties. However, in a further embodiment, an adhesive is included with the interface film to promote bonding with the metal surfaces of the heat sink and circuit board. In one application, the adhesive is added to the surface of both sides of the interface film prior to application of the release layer. In an alternative application, the adhesive is added to the interface mixture prior to forming it as a film.

4. Lamination Process

Figure 3:
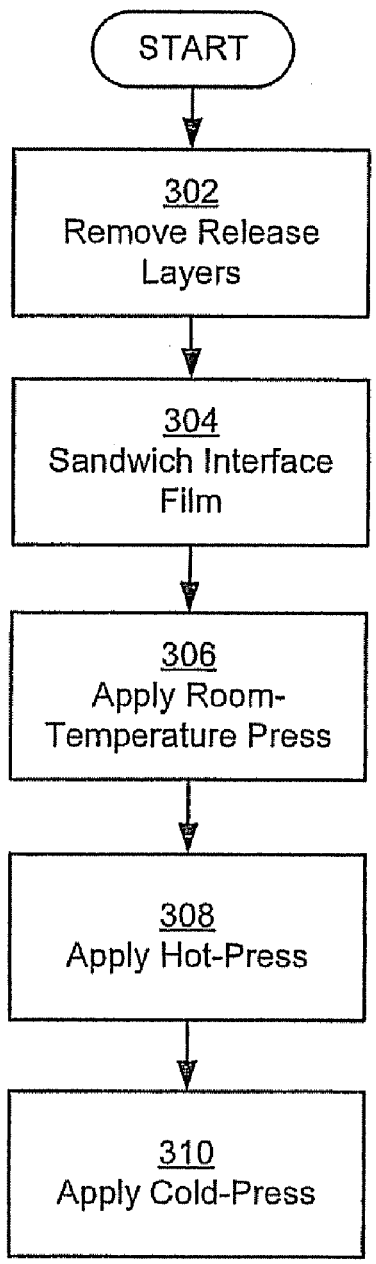
FIG. 3 is a process flow of an exemplary embodiment of a manufacturing process of a circuit board assembly using pre-manufactured interface film.

FIG. 3 provides an exemplary process flow for manufacturing the circuit board assembly with the pre-manufactured interface film. At 302, the release layers are removed from each side of the interface film to expose the film. At 304, the interface film is then sandwiched between the circuit board and the heat sink. Although FIG. 3 shows function 302 occurring prior to function 304, an embodiment provides that these steps are executed in an intertwined function. The intertwined function may include removing a first release layer from a first side of the interface film, then pressing the exposed side against a planar side of the heat sink. Once the interface film is (loosely) attached to the heat sink, the second release layer is removed to expose a second side of the interface film. The circuit board is then pressed against the second side to form the sandwich assembly shown in FIG. 1. Of course, in another embodiment, the intertwined function may be reversed so that the interface film is first attached to the circuit board and then attached to the heat sink. At this point, surfaces of the interface film are pliable and are configured to allow a high rate of surface contact.

Once the sandwich assembly is formed, at 306, a room-temperature pressure treatment is applied to the assembly—pressing the heat sink toward the circuit board. In operation, it is expected that this pressure treatment may be applied using a roller-assembly or other mechanisms. The room-temperature pressure treatment ideally works to (i) substantially remove any air-pockets that could reduce thermal conductivity and create 'hot spots' in the assembly and (ii) increase surface contact at the circuit board/film boundary as well as the heat sink/film boundary.

At 308, a high-temperate pressure treatment is applied to the assembly—again pressing the heat sink toward the circuit board. The high-temperature press is intended to promote curing of the interface film as well as bonding of the interface film to the adjacent metal. Typically, the high-temperature bonding may occur at a temperature of approximately 330 degrees Fahrenheit and a pressure of approximately 480 PSI for approximately 20 minutes. Of course, these parameters may vary according to a number of factors, such as the thickness and composition of the interface layer and the particular requirements of any curing catalyst used, for instance. In a further embodiment, the high-temperature pressure treatment includes application of a temperature of at least 320 degrees Fahrenheit and pressure of at least 500 PSI for at least 20 minutes.

At 310, a low-temperature pressure treatment is applied to the assembly—again pressing the heat sink toward the circuit board. According to the exemplary embodiment, the low-temperature pressure treatment is applied immediately following the high-temperature pressure treatment. The low-temperature may be room-temperature or another value at or below room temperature. In a further embodiment, the low-temperature is not a fixed temperature, but is a temperature that is reduced over time during the low-temperature pressure treatment.

In the high-temperature pressure treatment, the silicone matrix forms cross-links that are hardened/cured. The low-temperature pressure treatment cools the interface down to room temperature under pressure without letting any air trap between the bonded layers. This may be necessary to avoid delamination of the bonded layers. Once the assembly is cooled and properly cleaned to remove deleterious foreign materials, circuit components may be assembled on the circuit board. According to the exemplary embodiment, the low-temperature first pressure treatment is accomplished at a pressure of approximately 75 PSI for approximately 1 minute.

In a further embodiment, the circuit board has a metal base (such as a copper) that is attached directly to the interface film. Likewise, a planar surface of the heat sink is the portion attached to the other side of the interface film.

Prior to attaching the circuit board and heat sink to the interface film, it may be appropriate to prepare the metal surfaces—thus helping to ensure better adhesion to the film. The preparation may include, for instance, degreasing, chemical cleaning, desmutting, physical roughening of the metal surface, cleaning the surface with alcohol and applying a thin coat of a primer material. This conditions the bondable metal surfaces for better adhesion with the silicone material.

In a further embodiment, the outer surface of the aluminum surface may be given a surface finish of nickel and/or gold.

In another embodiment, anodizing the planar surface of the heat sink may serve to prepare the surface for binding with the interface film.

In an exemplary embodiment, the end result of the lamination process is that the circuit board assembly becomes a single element—the interface film bonded securely with both the metal bottom of the PCB and the planar surface of the heat sink. In some cases, excess interface material from an edge of the assembly may be trimmed.

5. Screen-Printing Process

In another exemplary embodiment, the thermally and electrically conductive mixture is provided in a screen-printable paste form. The screen printable form may provide a lower cost mechanism for creating a thermally and electrically conductive interface between the circuit board and the heat sink.

Figure 4:
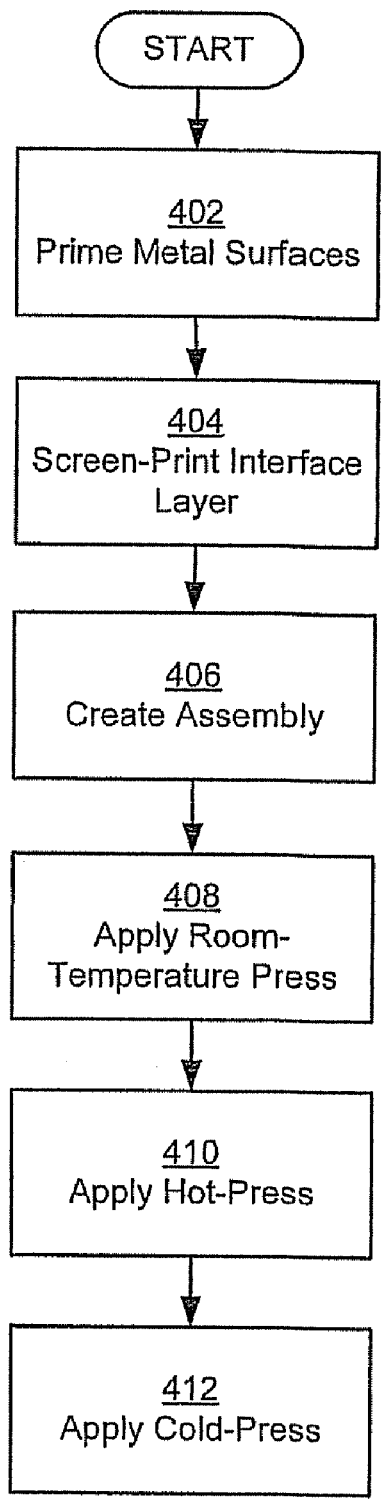
FIG. 4 is a process flow of an exemplary embodiment of a manufacturing process of a circuit board assembly using the interface material in a screen-printable paste form.

FIG. 4 provides an exemplary process flow for manufacturing the circuit board assembly with the thermally and electrically conductive mixture in screen-printable paste form. At 402, the metal surfaces of the circuit board and heat sink are cleaned and primed. As described above, this may include degreasing, chemical cleaning, desmutting, and physical roughening of the metal surface and then cleaning the surface with alcohol and applying a thin coat of a primer material.

At 404 an interface layer is screen printed onto one of the metal surfaces. According to various embodiments, either the metal base of the printed circuit board or the planar surface of the heat sink receives the screen printed layer. The screen printing may be adjusted to apply various layer thicknesses and pattern according to manufacturing specifications; in addition, the screen printing may be patterned to avoid artifacts in the circuit board such as vias and posts, for instance. The screen patterning technique includes stencil formation of required pattern on the screen. In a further embodiment, the screen-printing step is repeated until the interface layer is of a desired thickness. The screen printing can be performed manually or by a screen printing machine.

At 406 the interface layer is then sandwiched between the circuit board and the heat sink to create the assembly.

Once the sandwich assembly is formed, at 408, a room-temperature pressure treatment is applied to the assembly—pressing the heat sink toward the circuit board. In operation, it is expected that this room-temperature pressure treatment may be applied using a roller-assembly or other mechanisms (as may the other pressure treatments). The room-temperature pressure treatment ideally works to (i) substantially remove any air-pockets that could reduce thermal conductivity and create 'hot spots' in the assembly and (ii) increase surface contact at the circuit board/film boundary as well as the heat sink/film boundary. Of course, the room temperature press may provide other benefits.

At 410, a high-temperate pressure treatment is applied to the assembly—again pressing the heat sink toward the circuit board. The high-temperature press is intended to promote curing of the interface film as well as bonding of the interface film to the adjacent metal. Typically, the high-temperature bonding may be performed at a temperature of approximately 330 degrees Fahrenheit and a pressure of approximately 480 PSI for a duration of approximately 20 minutes. Of course, these parameters may vary according to a number of factors, such as the thickness and composition of the interface layer and the particular requirements of any curing catalyst used, for instance. In a further embodiment, the high-temperature pressure treatment includes application of a temperature of at least 320 degrees Fahrenheit and a pressure of at least 500 PSI for a duration of at least 20 minutes.

At 412, a low-temperature pressure treatment is applied to the assembly—again pressing the heat sink towards the circuit board. According to the exemplary embodiment, the low-temperature pressure treatment is applied immediately following the high-temperature pressure treatment. According to the exemplary embodiment, the low-temperature pressure treatment is accomplished at approximately 200 PSI for approximately for 10 minutes or until the assembly is properly cooled.

6. Alternative Embodiments

Figure 5:
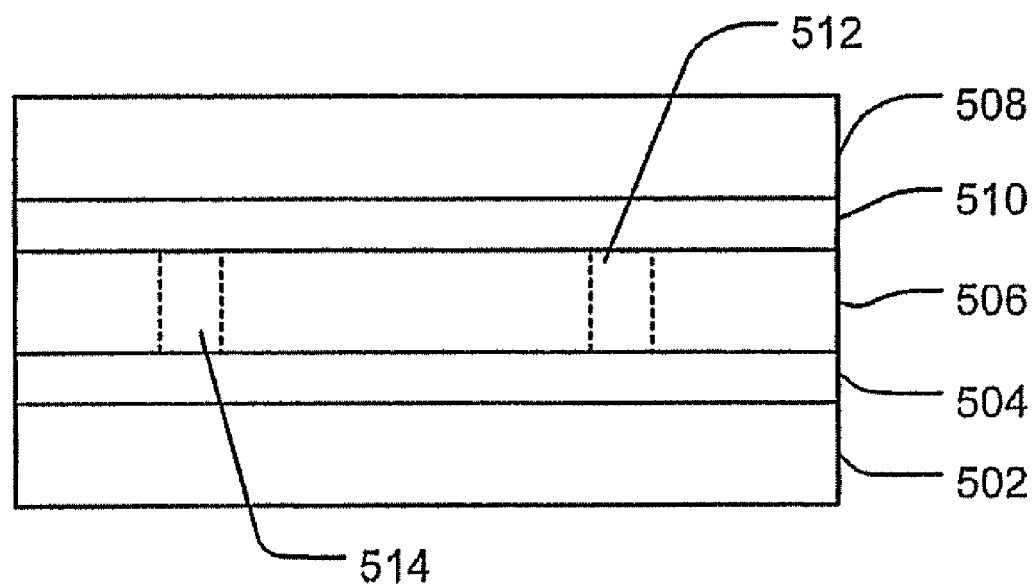
FIG. 5 is a simplified schematic illustrating application of the interface material in a multilayer assembly.

Of course, the silicone-based interface as described may be useful in more arenas than those specifically described in the examples above. For instance, FIG. 5 shows a multilayer circuit board using the interface. A multilayer printed circuit board may have multiple layers 508, 506 that are separated by a first interface 510. Thermal vias 514, 512 may thermally couple the first interface 510 with a second interface 504. Of course, there could be more circuit layers accompanied with corresponding conducting interface material locations, with the interface material serving as a conduit of heat and current to the sink. The second interface 504 being coupled with a heat sink 502.

In the embodiment of FIG. 5, the interface layers 504, 510 may be either pre-manufactured interface films or screen-printed interface layers. Filling the vias 514, 512 may be accomplished via screen-printing, injection, or other mechanical methods, for instance. Of course, FIG. 5 is a simplified embodiment. A working embodiment may include a greater number of thermal vias as well as more circuit board layers. The interface may also be useful to fill thermal channels that, for instance, shunt waste heat to an edge of the circuit board. The thermal channels may be filled in a similar fashion as the thermal vias. In a double-sided circuit board, the interface may also be used to shunt waste heat to a heat sink.

In yet another embodiment, the thermally and electrically conductive material may be used to couple an electronic component directly to a heat sink. For instance, the interface may be used to couple a processor, a LED device, an electric motor, or a power source directly with a heat sink.

7. Material Properties

Typical data for a six mil thick silicone interface film is provided in Table 1. The results shown in Table 1 are a summary of data obtained from test results performed on a preformed electrically and thermally conductive layer constructed in accordance with an exemplary embodiment.

TABLE 1

| Test Method | Property | Value |
| --- | --- | --- |
| ASTM D3767 | Thickness | 6 mil. |
| ASTM D412 | Tensile Strength | >200 PSI |
| ASTM D2240 | Hardness (Shore A) | 80-90 |
| ASTM D412 | Elongation | >200% |
|  | Tear Strength | >60 PPI |
| ASTM D5470 | Thermal Conductivity | 0.6 to 25.0 W/m-K |
| MIL G 83528 | Electrical Resistivity | <0.0007 ohmcm |

Of course, other embodiments may be constructed to achieve alternative results. For instance, an interface film may be manufactured with any thickness ranging from 5 mil upwards According to a preferred embodiment, it is important to maintain a substantially uniform thickness across a manufactured film in order to ensure a strong bond with the circuit board and heat sink.

CONCLUSION

A set of exemplary embodiments of the present invention has been described above. Those skilled in the art will understand, however, that changes and modifications may be made to these embodiments without departing from the true scope and spirit of the present invention, which is defined by the claims. For instance, in the process flow descriptions, certain steps may be removed or modified or eliminated without destroying utility of the process as a whole. Likewise, descriptions of the use of the interface material should not be seen to limit their use to those embodiments alone.

We claim:

1. A method of manufacturing a high or low frequency circuit board assembly having improved heat dissipation functionality comprising: providing a thermally and electrically conductive interface film including: a first side and a second side wherein the interface film comprises dimethyl polysiloxane, fire retardant, metal flakes and/or particles, a peroxide based catalyst, a first release layer protecting the first side, and a second release layer protecting the second side; removing the release layers; sandwiching the interface between a metal base layer of a printed circuit board and a planar side of a heat sink to form the assembly; first, in a room temperature hot press, applying a pressure of approximately 75 PSI for about 1 minute to the assembly to increase surface contact and to remove air pockets; then in the above hot press, applying a pressure of approximately 480 to 500 PSI to the assembly at a temperature of about 320 to 330 degrees Fahrenheit for at least 20 minutes to cure the interface and create a bonded laminate; and then in a cold press, applying a pressure of approximately 200 PSI to the assembly as the assembly cools to room temperature.

2. The method of claim 1, wherein the catalyst is benzoyl peroxide.

3. The method of claim 1, wherein the metal flakes and or particles are silver flakes, granular silver, silver plated metal or mixtures thereof.

4. The method of claim 1, further comprising: trimming excess interface material from an edge of the assembly.

5. The method of claim 1, wherein the interface film has a pre-laminate thickness of between 5 and 200 mils.

6. The method of claim 1, wherein the interface film has a pre-laminate thickness of approximately 6 mils.

7. The method of claim 1 further comprising, prior to sandwiching the interface, applying a primer to the planar surface of the printable circuit board.

* * * * *